United States Patent
Morikawa

(10) Patent No.: US 7,905,752 B2
(45) Date of Patent: Mar. 15, 2011

(54) CONNECTOR AND SUBSTRATE MOUNTING METHOD FOR THE SAME

(75) Inventor: Taishi Morikawa, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 137 days.

(21) Appl. No.: 12/181,550

(22) Filed: Jul. 29, 2008

(65) Prior Publication Data

US 2009/0035994 A1  Feb. 5, 2009

(30) Foreign Application Priority Data

Aug. 2, 2007 (JP) .............................. P2007-201973

(51) Int. Cl.
*H01R 13/66* (2006.01)

(52) U.S. Cl. .................................................. 439/620.09

(58) Field of Classification Search ............. 439/620.06, 439/620.09–620.19, 620.21–620.25; 29/832
See application file for complete search history.

(56) References Cited

U.S. PATENT DOCUMENTS

2004/0014362 A1 * 1/2004 Slack et al. ................... 439/620
2006/0276064 A1 * 12/2006 Takimura et al. ............. 439/108

FOREIGN PATENT DOCUMENTS

JP  2002-170632  6/2002
JP  2002-184532  6/2002

* cited by examiner

*Primary Examiner* — Ross N Gushi
(74) *Attorney, Agent, or Firm* — Finnegan, Henderson, Farabow, Garrett & Dunner, L.L.P.

(57) ABSTRACT

A connector includes a connector housing made of an insulator, a first terminal having one end fixed to the connector housing and the other end connected to an opposite side connector, and a second terminal having one end electrically connected to a circuit on a substrate and the other end fixed to the connector housing. The connector housing includes an opening which is open in a direction orthogonal to a surface of the substrate in a state of being mounted on the substrate and through which one end of the first terminal and the other end of the second terminal enter. The opening permits an electronic component being connected to one end of the first terminal and the other end of the second terminal to enter thereinto.

11 Claims, 10 Drawing Sheets

CONNECTOR AND SUBSTRATE MOUNTING METHOD FOR THE SAME

CROSS REFERENCE TO RELATED APPLICATION

This application claims benefit of priority under 35 USC 119 based on Japanese Patent Application P2007-201973 filed Aug. 2, 2007, the entire contents of which are incorporated by reference herein.

BACKGROUND OF THE INVENTION

1. Field of the Invention

The present invention relates to a connector and a substrate mounting method for the same.

2. Description of the Related Art

A conventionally known connector with a built-in electronic component includes a connector housing, first and second terminals, and a chip-shaped electronic component. One end of each of the first and second terminals is fixed to the connector housing. The other end of each of the first and second terminals is electrically connected to a substrate circuit. The ends of the first and second terminals fixed to the connector housing are electrically connected to each other by the electronic component. In the connector with the built-in electronic component is connected to the first and second terminals by solder, and one end of the second terminal is connected to the substrate circuit (wiring pattern formed on a substrate) by solder (Japanese Patent Application Laid-Open Nos. 2002-184532 and 2002-170632).

SUMMARY OF THE INVENTION

In the case of the connectors described in Japanese Patent Application Laid-Open Nos. 2002-184532 and 2002-170632, however, the electronic component is connected to the first and second terminals by solder before one end of the second terminal is connected to the substrate circuit by solder. Thus, heat generated by soldering between one end of the second terminal and the substrate circuit melts the solder of the electronic component soldered first, creating a possibility of a connection failure of the electronic component.

To check whether solder melting has caused disconnection of the electronic component, in the case of the connector described in Japanese Patent Application Laid-Open No. 2002-184532, the checking can be carried out through looking-into from a connector housing chamber. However, as the connector housing chamber opens horizontally with respect to a substrate surface, if connectors are densely arranged on the substrate, the other connectors have to be removed, increasing time and labor for checking.

The present invention has been developed to solve the aforementioned problems, and provides a connector capable of suppressing a connection failure of an electronic component and reducing time and labor for checking a connected state of the electronic component, and a substrate mounting method for the same.

According to a first aspect of the present invention, a connector includes a connector housing made of an insulator, having a first opening; a first terminal having a first end fixed to the connector housing and a second end connected to an opposite side connector; and a second terminal having a first end electrically connected to a circuit of a substrate and a second end fixed to the connector housing. The first end of the first terminal and the second end of the second terminal enter into the first opening. The first opening is open in a direction orthogonal to a surface of the substrate in a state where the connector is mounted on the substrate and is formed so as to permit an electronic component being connected to the first end of the first terminal and the second end of the second terminal to enter thereinto.

In the connector of the invention, preferably, an inner wall of the first opening positions or holds the electronic component.

The connector of the invention may further include a shield covering the connector housing. Preferably, the shield case includes a second opening opened in a place matched with the first opening in a state of covering the connector housing. The first and second openings permit the electronic component to enter thereinto.

In the connector of the invention, preferably, the first opening permits a capacitor being connected to the first end of the first terminal and the second end of the second terminal to enter thereinto.

In the connector of the invention, preferably, the second end is mounted on the circuit to be electrically connected to the circuit.

In the connector of the invention, preferably, the first end of the second terminal is bended in a direction parallel to the surface of the substrate to be electrically connected to the circuit. In this case, a bended portion of the first end of the second terminal may be located higher than a bottom surface of the connector housing to arrange solder between the bended portion and the circuit.

According to a second aspect of the present invention, a connector includes a connector housing made of an insulator, having a first opening; a connection terminal fixed to the connector housing and having one end electrically connected to a circuit of a substrate and the other end connected to an opposite side connector; and a shield case covering the connector housing and being electrically connected partially to a ground of the circuit. The first opening is open in a direction orthogonal to a surface of the substrate in a state of being mounted on the substrate. A part of the connection terminal enters into the first opening. The shield case includes a second opening opened in a place matched with the first opening in a state of covering the connector housing. The first and second openings permit a capacitor being connected to the part of the connection terminal and the shield case to enter thereinto.

In the connector of the invention, preferably, the connection terminal is mounted on the circuit to be electrically connected to the circuit.

In the connector of the invention, preferably, an end of the connection terminal is bended in a direction parallel to the surface of the substrate to be electrically connected to the circuit. In this case, a bended portion of connection terminal may be located higher than a bottom surface of the connector housing to arrange solder between the bended portion and the circuit.

According to a third aspect of the present invention, a method for mounting a connector on a substrate includes a housing formation step of forming a connector housing made of an insulator and including an opening opened in a direction orthogonal to a surface of the substrate in a state of being mounted on the substrate, a terminal fixing step of fixing a first end of a first terminal having a second end connected to an opposite side connector and a second end of a second terminal having a first end electrically connected to a circuit on the substrate to the connector housing formed in the housing formation step in a state of entering through the opening, a mounting preparation step of mounting the connector housing to which the first and second terminals have been fixed in the terminal fixing step on the substrate, arranging the first end of the second terminal corresponding to the circuit, and entering an electronic component from the opening of the connector housing, and a substrate mounting step of electrically connecting the first end of the second terminal to the circuit brought into contact with the circuit in the mounting preparation step, and electrically connecting the first end of the first terminal and the second end of the second terminal to each other via the entered electronic component.

According to a fourth aspect of the present invention, a method for mounting a connector on a substrate includes a housing formation step of forming a connector housing made of an insulator and including a first opening opened in a direction orthogonal to a surface of the substrate in a step of being mounted on the substrate, a shield case formation step of forming a shield case including a second opening opened in a place matched with the first opening in a state of covering the connector housing, a terminal fixing step of fixing a connection terminal having one end electrically connected to a circuit on the substrate and the other end connected to an opposite side connector to the connector housing formed in the housing formation step to enter a part of the connection terminal through the first opening, a mounting preparation step of mounting the connector housing to which the connection terminal has been fixed in the terminal fixing step to bring one end of the second terminal into contact with the circuit, bringing a part of the shield case into contact with a ground of the circuit in a state of covering the connector housing mounted on the substrate with the shield case formed in the shield case formation step, and entering a capacitor from the first opening of the connector housing and the second opening of the shield case, and a substrate mounting step of electrically connecting one end of the connection terminal brought into contact with the circuit in the mounting preparation step to the circuit, electrically connecting the connected terminal and the shield case to each other via the entered capacitor, and electrically connecting a part of the shield case to the ground of the circuit.

According to the connector of the present invention, the electronic component to be connected to the first end of the first terminal and the second end of the second terminal can be entered from the first opening. Thus, a connector having no electronic component mounted thereon is manufactured, the electronic component can be entered from the first opening immediately before the second terminal is soldered to the circuit on the substrate, and soldering to mount the electronic component and soldering to electrically connect the second terminal to the circuit can be simultaneously carried out. Accordingly, removal of the electronic component caused by heat generated during soldering of the second terminal can be prevented. As the first opening is open in the direction orthogonal to the surface of the substrate, a connected state of the electronic component can be checked from the orthogonal direction, and checking work can be carried out relatively easily even in the densely arranged state of the connectors. As a result, a connection failure of the electronic component can be suppressed, and time and labor for checking the connected state of the electronic component can be reduced.

As the first opening positions or holds the electronic component by its inner wall, shifting of the electronic component can be suppressed, further suppressing a connection failure of the electronic component.

The connector further includes the shield case, and the shield case includes a second opening opened in the place matched with the first opening in the state of covering the connector housing. Thus, in the connector including the shield case, a connection failure of the electronic component can be suppressed, and time and labor for checking a connected state of the electronic component can be reduced.

The connector is configured to permit the capacitor to enter thereinto. Thus, even for a high-frequency signal transmission connector using the capacitor, a connection failure of the electronic component can be suppressed, and time and labor for checking the connected state of the electronic component can be reduced.

The second terminal is mounted on the circuit to be electrically connected to the same. Thus, even for a connector of a type which includes the second terminal mounted on the surface, a connection failure of the electronic component can be suppressed, and time and labor for checking the connected state of the electronic component can be reduced.

According to the connector of the invention, the capacitor connected to the connection terminal and the shield case can be entered from the first and second openings. Thus, a connector having no capacitor mounted thereon is manufactured, the capacitor can be entered from the first and second openings immediately before the connection terminal is soldered to the circuit, and soldering to mount the capacitor and soldering to electrically connect the connection terminal to the circuit can be simultaneously carried out. As a result, removal of the capacitor caused by heat generated during soldering of the connection terminal can be prevented. Moreover, as the first opening is open in the direction orthogonal to the surface of substrate, and the second opening matches the first opening, a connected state of the capacitor can be checked from the orthogonal direction, and checking work can be carried out relatively easily even in a densely arranged state of connectors. Thus, a connection failure of the electronic component can be suppressed, and time and labor for checking a connected state of the electronic component can be reduced. The shield case is electrically connected to the ground of the circuit on the substrate, and the capacitor can be entered from the second opening. Thus, soldering of the shield case can be carried out simultaneously with soldering of the other components. As a result, removal of the electronic component caused by heat generated during soldering of the shield case can be prevented. Besides, as the connection terminal and the shield case are electrically connected to each other, a high-frequency wave flowing through the connection terminal can be removed.

The connection terminal is mounted on the surface of the circuit to be electrically connected to the circuit. Thus, even for a connector of a type in which the connection terminal is mounted on the surface of the substrate, a connection failure of the electronic component can be suppressed, and time and labor for checking a connected state of the electronic component can be reduced.

According to the substrate mounting method for the connector 1 of the invention, in the same step as that of electrically connecting the first end of the second terminal to the circuit on the substrate, the first end of the first terminal and the second end of the second terminal are electrically connected to each other via the electronic component. Thus, soldering to mount the electronic component and soldering to electrically connect the second terminal to the circuit are simultaneously carried out to enable prevention of removal of the electronic component caused by heat generated during soldering of the second terminal. As the first opening is open in the direction orthogonal to the surface of the substrate, the connected state of the electronic component can be checked from the orthogonal direction after electrical connection of the second terminal to the circuit on the substrate and mounting of the electronic component, and checking work can be carried out relatively easily even in the densely arranged state of the connectors. Thus, a connection failure of the electronic component can be suppressed, and time and labor for checking the connected state of the electronic component can be reduced.

According to the substrate mounting method for the connector of the invention, in the same step as that of connecting one end of the connection terminal to the circuit on the substrate, a part of the connection terminal is connected to the shield case via the capacitor. Thus, soldering to mount the capacitor and soldering to electrically connect the connection terminal to the shield case are simultaneously carried out, enabling prevention of removal of the capacitor caused by heat generated during soldering of the connection terminal. As the first opening is open in a direction orthogonal to the surface of the substrate, and the second opening matches the opening, after the connection terminal is electrically connected to the circuit, and the capacitor is mounted, a connected state of the capacitor can be checked from the orthogonal direction, and checking work can be carried out relatively easily even in a densely arranged state of capacitors. Thus, a connection failure of the electronic component can be suppressed, and time and labor for checking a connected state of the electronic component can be reduced. Moreover, the shield case is electrically connected to the ground of the circuit in the same step as that of electrically connecting one end of the connection terminal to the circuit and the step of electrically connecting the connection terminal and the shield case to each other via the capacitor. Thus, mounting of the shield case is simultaneously carried out, enabling prevention of removal of the capacitor caused by heat generated during soldering of the shield case. Besides, as the connection terminal and the shield case are electrically connected to each other, a high-frequency wave flowing through the connection terminal can be removed.

BRIEF DESCRIPTION OF THE DRAWINGS

FIG. 4A showing a first example, and FIG. 4B showing a second example.

DESCRIPTION OF THE EMBODIMENTS

Figure 1:
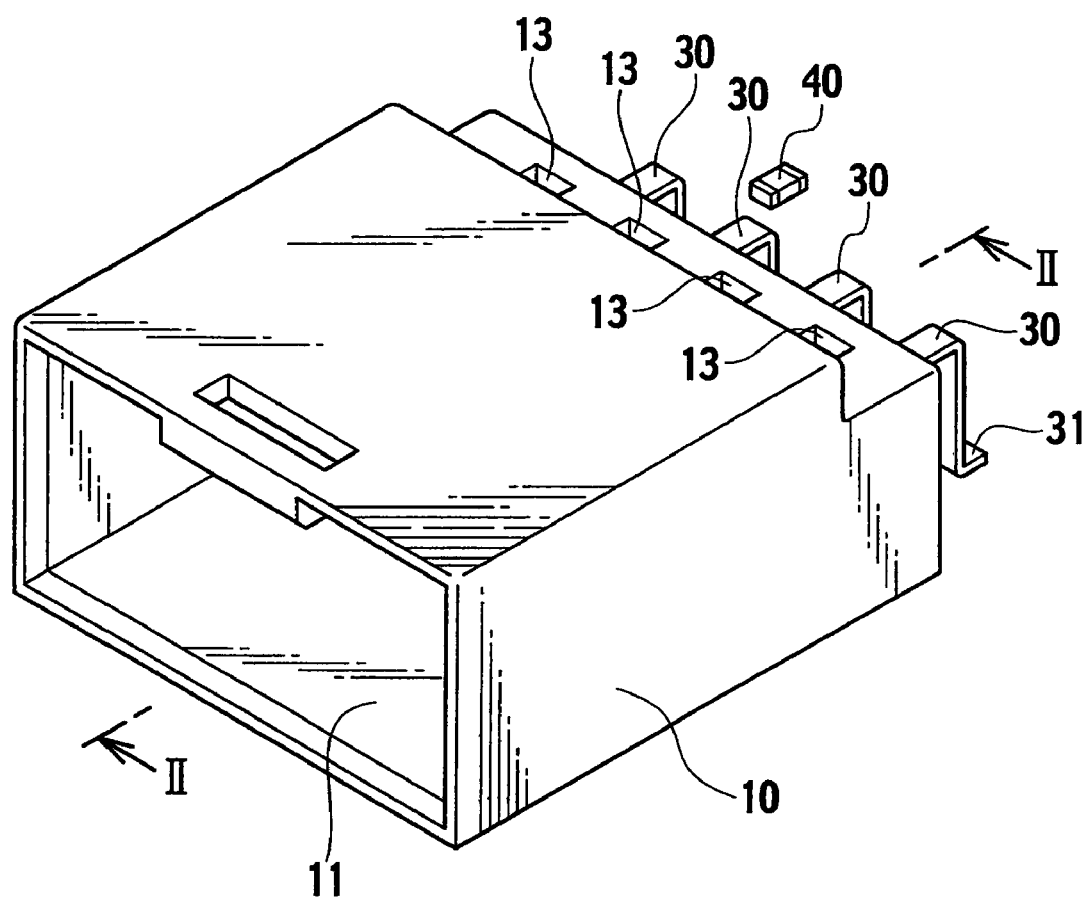
FIG. 1 is an appearance perspective diagram illustrating a connector according to a first embodiment of the present invention.
Figure 2:
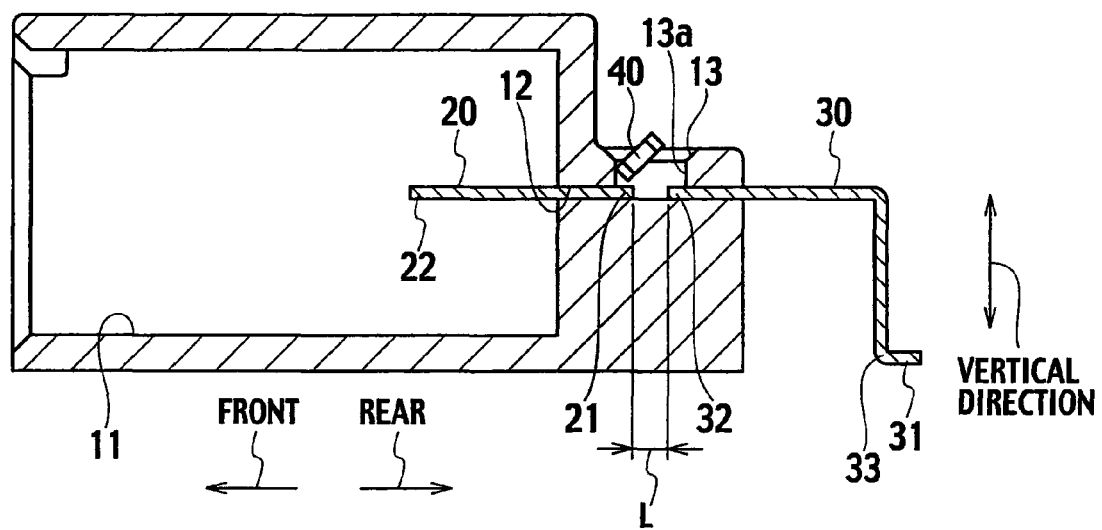
FIG. 2 is a side sectional diagram illustrating a II-II section of FIG. 1 from a side.
Figure 3:
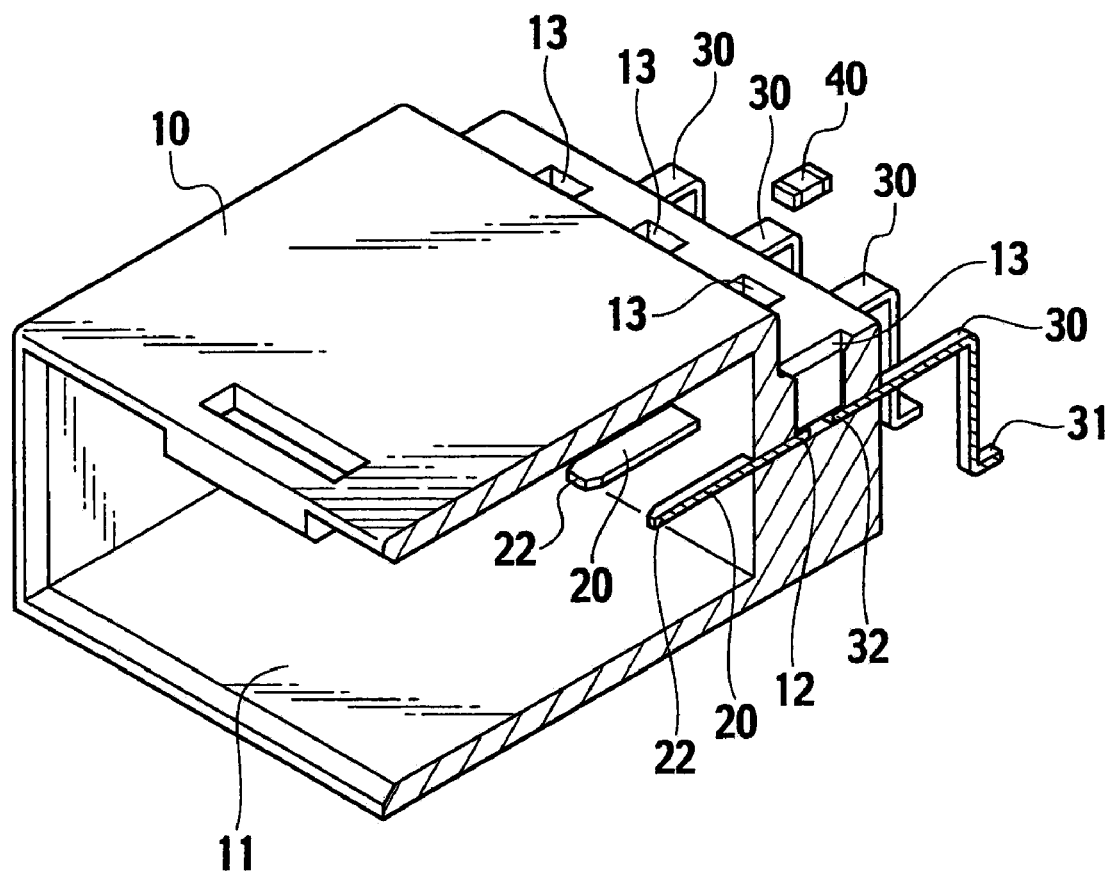
FIG. 3 is a perspective sectional diagram illustrating the II-II section of FIG. 1.

The exemplary embodiments of the present invention will be described below with reference to the drawings. As shown in FIGS. 1 to 3, a connector 1 on which an electronic component 40 such as a capacitor is mounted includes a connector housing 10, a plurality of first terminals 20, and a plurality of second terminals 30. The connector housing 10 is an insulator formed into a roughly rectangular cylindrical shape, and a terminal housing space 11 is formed in the cylinder. According to the embodiment, the connector housing 10 is made of a liquid crystal polymer (LCP) or a polyphenylene sulfide (PPS).

As shown in FIGS. 2 and 3, the connector housing 10 includes a plurality of through-holes 12 and a plurality of openings 13. The plurality of through-holes 12 are holes into which the first and second terminals 20 and 30 are inserted, and linearly formed on a side (rear side) opposed to a cylinder opening side (front side). Locking recesses (not shown) are formed in the plurality of through-holes 12.

Figure 6:
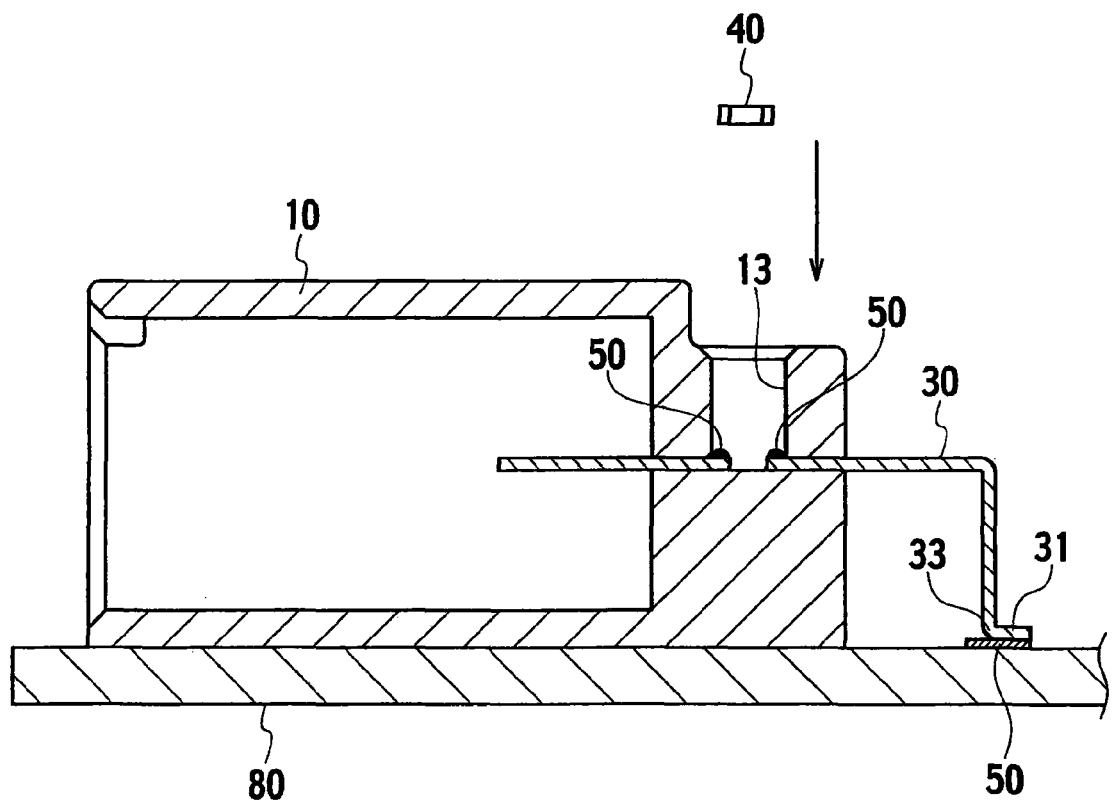
FIG. 6 is a side sectional diagram illustrating a state of a connector 1 after execution of a mounting preparation process.

The plurality of openings 13 are holes bored in a direction (vertical direction) orthogonal to a substrate surface in a mounted state of the connector 1 on a substrate 80 (see also FIG. 6). From this opening 13, the electronic component 40 such as a chip-shaped capacitor can be entered. The plurality of openings 13 is each opened in a shape of positioning or holding the electronic component 40 by an inner wall 13a.

Figure 4A:
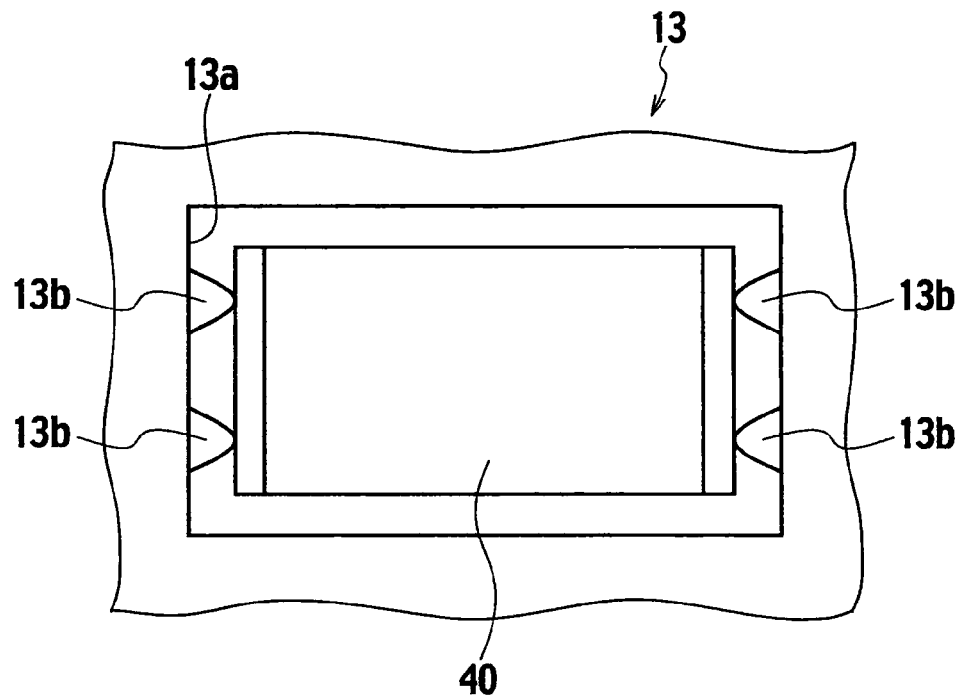
FIGS. 4A and 4B are upper surface diagrams illustrating an opening of FIG. 1 in detail.
Figure 4B:
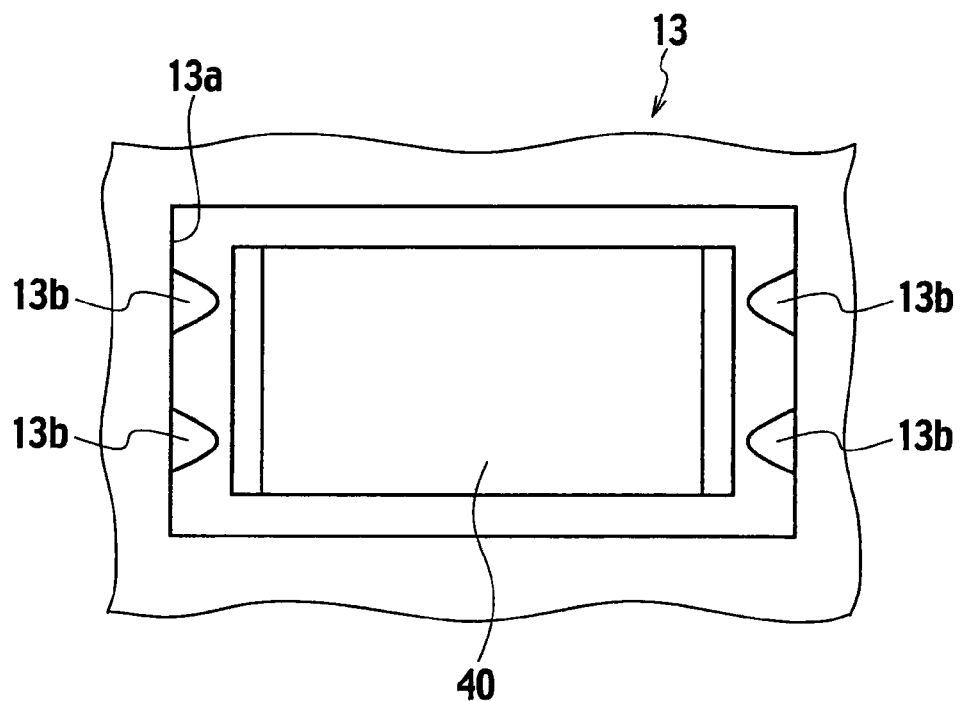

FIGS. 4A and 4B are upper surface diagrams illustrating the opening 13 of FIG. 1 in detail: FIG. 4A showing a first example, and FIG. 4B showing a second example. Hereinafter, in a mounted state of the connector 1 on the substrate 80, a direction from the substrate 80 to the connector 1 is an up-direction, while a direction from the connector 1 to the substrate 80 is a down-direction. As shown in FIG. 4A, the inner wall 13a of the opening 13 includes, for example, four projections 13b. The inner wall 13a positions or holds the electronic component 40 through these projections 13b. The number of projections 13 is not limited to four, but any number may be employed. As long as the opening 13 can position or hold the electronic component 40 by the inner wall, there is no particular limitation on a shape, nor any projection 13b may be necessary. As shown in FIG. 4B, the opening 13 doesn't have to completely fix the electronic component 40 such as a capacitor to the inner wall 13a. The opening 13 only needs to position the electronic component 40 so that a good connected state can be set.

Referring again to FIGS. 2 and 3, the plurality of first terminals 20 are long and flat plate-shaped metal pieces. One end (first end) 21 of each of first terminals 20 includes a locking projection (not shown), and is inserted into the through-hole 12 of the connector housing 10 to lock the locking projection in the locking recess. Accordingly, the plurality of first terminals 20 are connected to the connector housing 10. On the other hand, the other end (second end) 22 of each of first terminals 20 projects into the terminal housing space 11 to be electrically connected with a terminal of an opposite side connector (not shown).

The plurality of second terminals 30 are long and flat plate-shaped metal pieces, and formed into shapes in which the long and flat plate-shaped metal pieces are bent by 90° at two places. One end (first end) 31 of the plurality of second terminals 30 extends to the rear side of the connector housing 10, and a first bent part 33 from the rear side is mounted on a surface of the substrate circuit to be electrically connected to the substrate circuit. The other end (second end) 32 of the plurality of second terminals 30 includes a locking projection (not shown), and is inserted into the through-hole 12 of the connector housing 10 to lock the locking projection in the locking recess. Thus, the plurality of second terminals 30 are fixed to the connector housing 10.

The first and second terminals 20 and 30 partially enter the opening 13 in the connected state to the connector housing 10. In other words, as shown in a sectional diagram of FIG. 2, one end 21 of the first terminal 20 and the other end 32 of the second terminal 30 enter the opening 13. The first and second terminals 20 and 30 are separated by a certain distance L not to come into contact with each other in the connected state to the connector housing 10.

Figure 5:
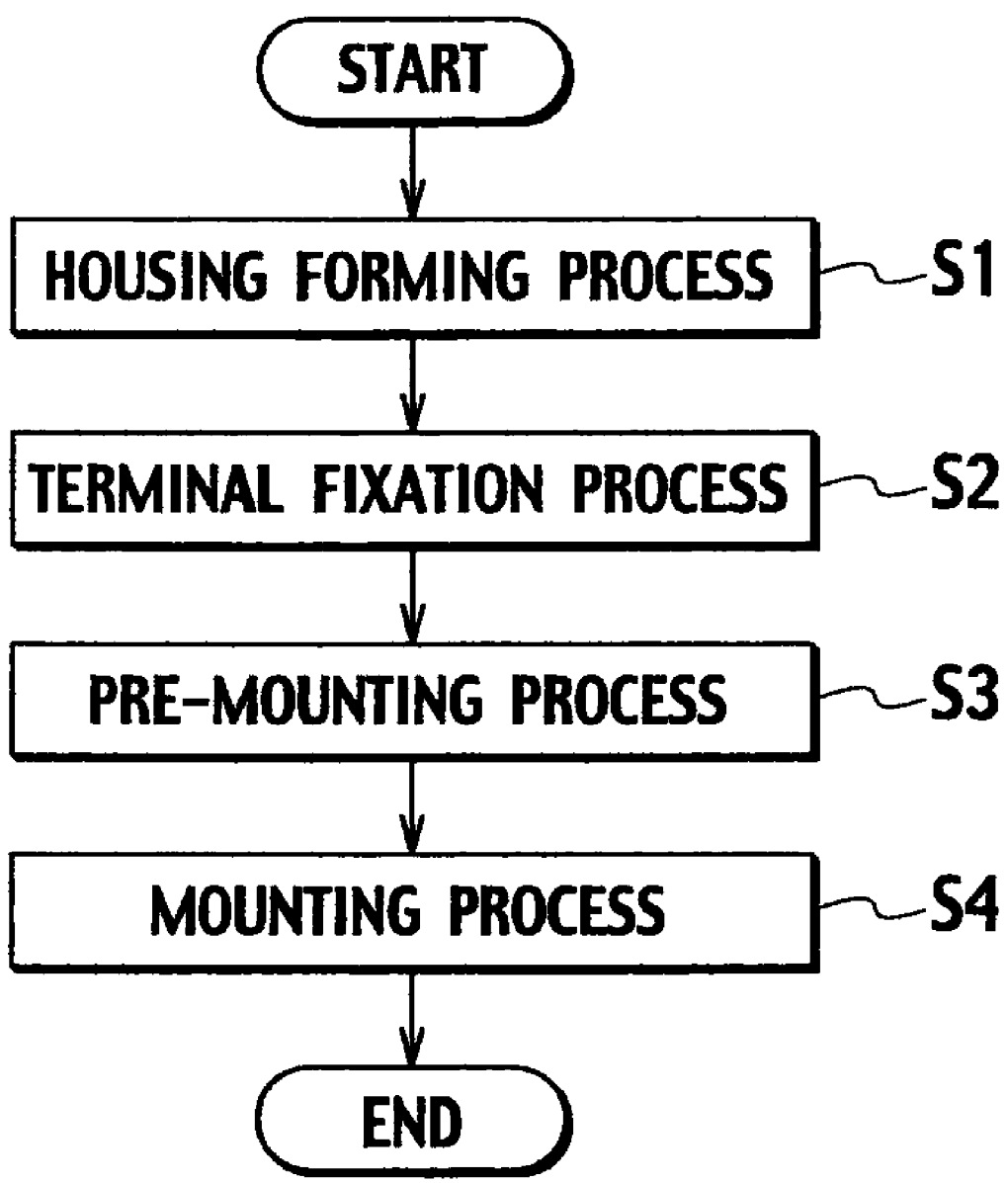
FIG. 5 is a flowchart illustrating a substrate method for the connector according to the first embodiment.

Next, a method for mounting the connector 1 on the substrate 80 according to the first embodiment will be described. FIG. 5 is a flowchart illustrating the substrate mounting method for the connector 1 according to the first embodiment. As shown in FIG. 5, housing formation (housing forming process) is carried out (S1). In this step, the connector housing 10 shown in FIG. 1 is formed. During formation of the connector housing 10, a through-hole 12 and an opening 13 are formed.

Terminal fixing (terminal fixation process) is carried out (S2). In this step, a plurality of first terminals 20 and a plurality of second terminals 30 are inserted into the through-holes 12 of the connector housing 10 to be fixed. In this case, one end 21 of the first terminal 20 and the other end 32 of the second terminal 30 enter the opening 13 to be exposed to the outside.

Mounting preparation (pre-mounting process) is carried out (S3). In this step, the connector housing 10 to which the plurality of first terminals 20 and the plurality of second terminals 30 have been fixed in the terminal fixing step is mounted on a predetermined place of the substrate 80. FIG. 6 is a side sectional diagram illustrating a state of the connector 1 after execution of the mounting preparation. As shown in FIG. 6, because of the mounting of the connector housing 10 in the predetermined place of the substrate 80, one end 31 (bent part 33) of the second terminal 30 is arranged in a position corresponding to the substrate circuit. The predetermined position of the substrate circuit is coated beforehand with cream solder 50, and one end 31 of the second terminal 30 is arranged to come into contact with the cream solder 50.

In this step, the electronic component 40 is entered from each of the plurality of openings 13 of the connector housing 10. One end 21 of the plurality of first terminals 20 and the other end 32 of the plurality of second terminals 30 are coated beforehand with cream solder 50, and the electronic component 40 is entered to come into contact with the cream solder 50. The cream solder 50 may be applied beforehand on the electronic component 40.

Then, substrate mounting (mounting process) is carried out (S4). In this step, the connector housing 10 which has been mounted on the substrate 80 in the mounting preparation step and which has received the electronic component 40 is put into a reflow furnace together with the substrate 80. Accordingly, the cream solder 50 is melted to connect one end 31 of the second terminal 30 to the substrate circuit. One end 21 of the first terminal 20 and the other end 32 of the second terminal 30 are connected to each other by solder via the electronic component 40. Thus, according to the substrate mounting method of the first embodiment, the electrical connection of the second terminal 30 with the substrate circuit and the electrical connection of the electronic component 40 are simultaneously carried out.

According to the substrate mounting method, the connector housing 10 is put into the reflow furnace to carry out soldering. Not limited to this, however, the cream solder 50 may be irradiated with a laser beam to simultaneously carry out the electrical connection of the second terminal with the substrate circuit and the electrical connection of the electronic component 40.

According to the connector 1 of the first embodiment, the electronic component 40 to be connected to one end 21 of the first terminal 20 and the other end 32 of the second terminal 30 can be entered from the opening 13. Thus, the connector 1 having no electronic component 40 mounted thereon is manufactured, the electronic component 40 can be entered from the opening 13 immediately before the second terminal 30 is soldered to the substrate circuit, and soldering to mount the electronic component 40 and soldering to electrically connect the second terminal 30 to the substrate circuit can be simultaneously carried out. Accordingly, removal of the electronic component 40 caused by heat generated during soldering of the second terminal 30 can be prevented. As the opening 13 is open in the direction orthogonal to the substrate surface, a connected state of the electronic component 40 can be checked from the orthogonal direction, and checking work can be carried out relatively easily even in the densely arranged state of the connectors 1. As a result, a connection failure of the electronic component 40 can be suppressed, and time and labor for checking the connected state of the electronic component 40 can be reduced.

As the opening 13 positions or holds the electronic component 40 by its inner wall 13a, shifting of the electronic component 40 can be suppressed, further suppressing a connection failure of the electronic component 40.

The capacitor can be entered. Thus, even for a high-frequency signal transmission connector using the capacitor, a connection failure of the electronic component 40 can be suppressed, and time and labor for checking the connected state of the electronic component 40 can be reduced.

The second terminal 30 is mounted on the surface of the substrate circuit to be electrically connected to the same. Thus, even for a connector of a type which includes the second terminal 30 mounted on the substrate surface, a connection failure of the electronic component 40 can be suppressed, and time and labor for checking the connected state of the electronic component 40 can be reduced.

According to the substrate mounting method for the connector 1 of the first embodiment, in the step of electrically connecting one end 31 of the second terminal 30 to the substrate circuit, one end 21 of the first terminal 20 and the other end 32 of the second terminal 30 are electrically connected to each other via the electronic component 40. Thus, soldering to mount the electronic component 40 and soldering to electrically connect the second terminal 30 to the substrate circuit are simultaneously carried out to enable prevention of removal of the electronic component 40 caused by heat generated during soldering of the second terminal 30. As the opening 13 is open in the direction orthogonal to the substrate surface, the connected state of the electronic component 40 can be checked from the orthogonal direction after electrical connection of the second terminal 30 to the substrate circuit and mounting of the electronic component 40, and checking work can be carried out relatively easily even in the densely arranged state of the connectors 1. Thus, a connection failure of the electronic component 40 can be suppressed, and time and labor for checking the connected state of the electronic component 40 can be reduced.

Next, a connector 2 according to a second embodiment will be described. The connector 2 of the second embodiment is similar to that of the first embodiment except for some components. A difference from the first embodiment will be described below.

Figure 7:
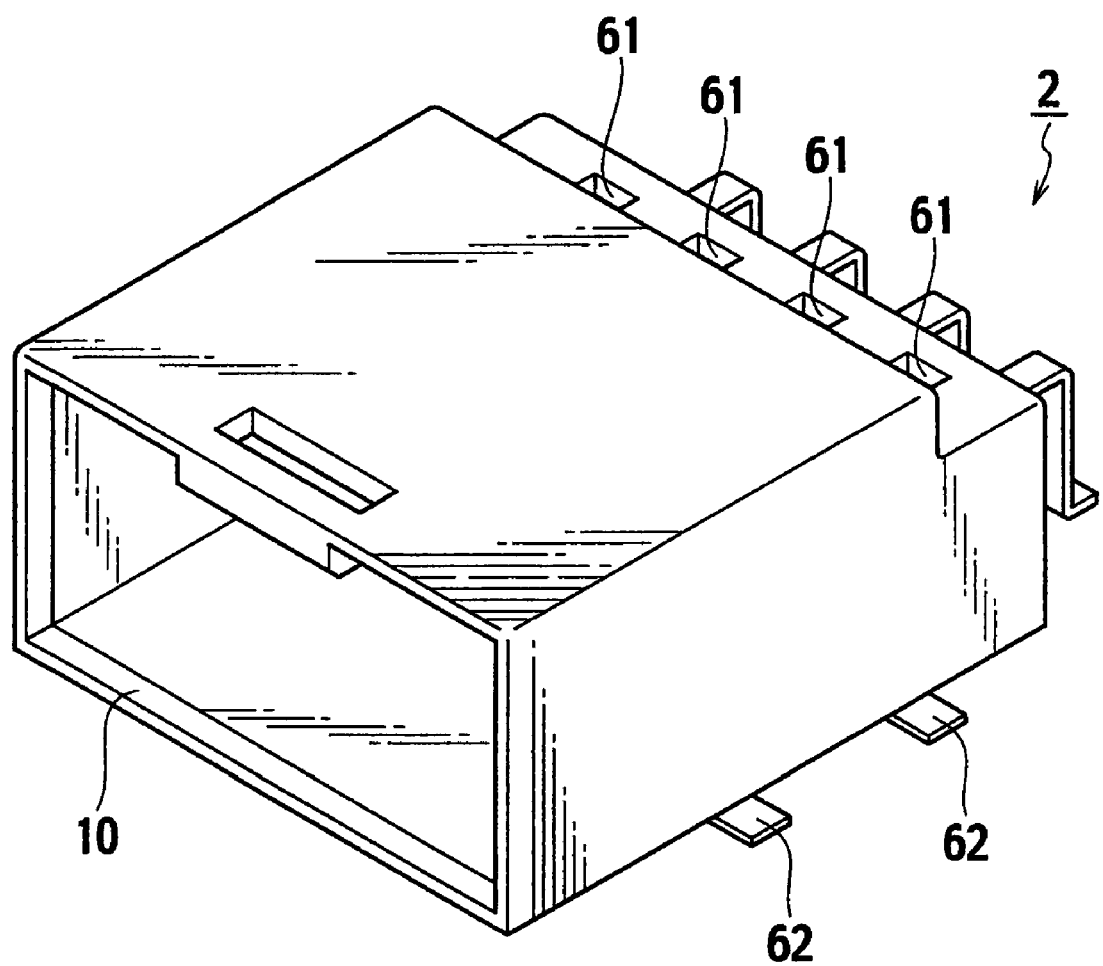
FIG. 7 is an appearance perspective diagram illustrating a connector according to a second embodiment of the present invention.

FIG. 7 is an appearance perspective diagram illustrating the connector 2 according to the second embodiment. As shown in FIG. 7, the connector 2 of the second embodiment further includes a shield case 60. The shield case 60 is made of a copper plate to cover the connector housing 10. The shield case 60 includes a second opening 61 in a place matched with the opening 13 in a state of covering the connector housing 10. The shield case 60 further includes a plurality of projected pieces 62 in a lower end, and the plurality of projected pieces 62 are connected to a ground on the circuit substrate on the substrate 80 (see also FIG. 6).

Figure 8:
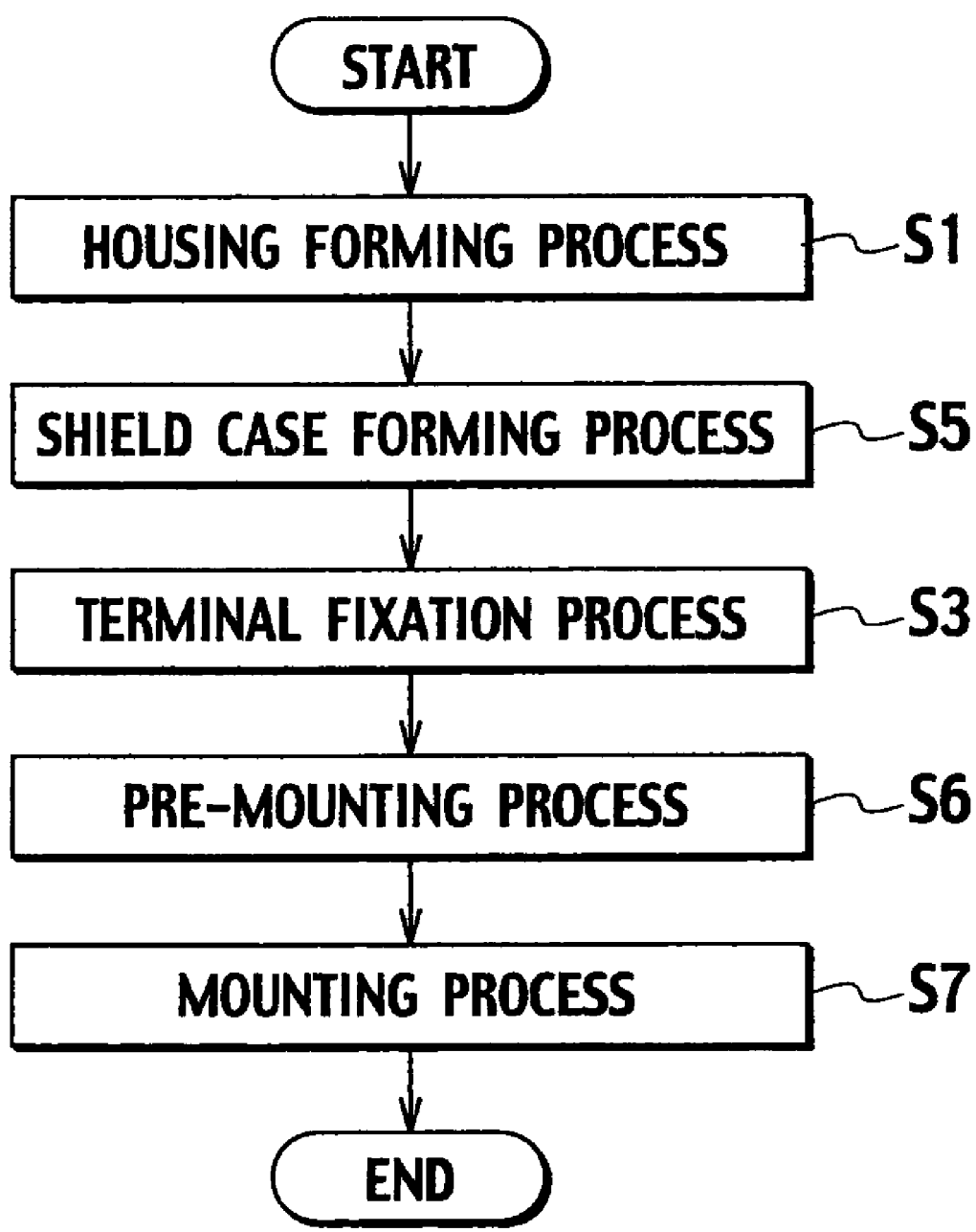
FIG. 8 is a flowchart illustrating a substrate mounting method for the connector according to the second embodiment.

Next, a method for mounting the connector 2 on the substrate according to the second embodiment will be described. FIG. 8 is a flowchart illustrating the substrate mounting method for the connector 2 according to the second embodiment. As shown in FIG. 8, housing formation is carried out (S1). This step is similar to that of the first embodiment.

Shield case formation is carried out (S5). In this step, a copper plate is subjected to die cutting or press molding to form a shield case 60 which includes a second opening 61.

Terminal fixing is carried out (S2). This step is similar to that of the first embodiment.

Mounting preparation (S6) is carried out. In this step, in addition to the mounting preparation step (S3) of the first embodiment, mounting preparation of the shield case 60 is carried out. In other words, the shield case 60 is mounted to cover the connector housing 10, and projected pieces 62 of the shield case 60 are arranged corresponding to the ground of the substrate circuit. The ground of the substrate circuit has been coated with cream solder 50, and the shield case 60 is mounted to come into contact with the cream solder 50.

Then, substrate mounting is carried out (S7). In this step, in addition to the mounting preparation step (S3) of the first embodiment, mounting of the shield case 60 is carried out. In other words, not only the connector housing 10 but also the shield case 60 mounted on the substrate in the mounting preparation step are put into a reflow furnace together with the substrate 80. Accordingly, in the reflow furnace, electrical connection of the second terminal with the substrate circuit, connection of the electronic component 40, and mounting of the shield case 60 are simultaneously carried out.

According to the connector 2 of the second embodiment, as in the case of the first embodiment, a connection failure of the electronic component 40 can be suppressed, and time and labor for checking a connected state of the electronic component 40 can be reduced. Shifting of the electronic component 40 is suppressed, thereby suppressing a connection failure of the electronic component 40 more. Even for a high-frequency signal transmission connector using a capacitor, a connection failure of the electronic component 40 can be suppressed, and time and labor for checking a connected state of the electronic component 40 can be reduced. For a connector of a type in which a second terminal 30 is mounted on a substrate surface, a connection failure of the electronic component 40 can be suppressed, and time and labor for checking a connected state of the electronic component 40 can be reduced.

According to the second embodiment, the connector 1 further includes the shield case 60, and the shield case 60 includes the second opening 61 opened in a place matched with the opening 13 in the state of covering the connector housing 10. Thus, for the connector 2 including the shield case 60, a connection failure of the electronic component 40 can be suppressed, and time and labor for checking a connected state of the electronic component 40 can be reduced.

According to the substrate mounting method for the connector 2 of the second embodiment, as in the case of the first embodiment, a connection failure of the electronic component can be suppressed, and time and labor for checking a connected state of the electronic component can be reduced.

According to the second embodiment, in the same step as that of connecting one end 31 of the second terminal 30 to the substrate circuit and that of connecting one end 21 of the first terminal 20 and the other end 32 of the second terminal 30 to each other via the electronic component 40, the shield case 60 is connected to the ground of the substrate circuit. Thus, the shield case 60 can simultaneously be mounted, enabling prevention of removal of the electronic component 40 caused by heat generated during soldering of the shield case 60.

Next, a connector 3 according to a third embodiment of the present invention will be described. The connector 3 of the third embodiment is similar to that of the second embodiment except for some components. A difference from the first embodiment will be described below.

Figure 9:
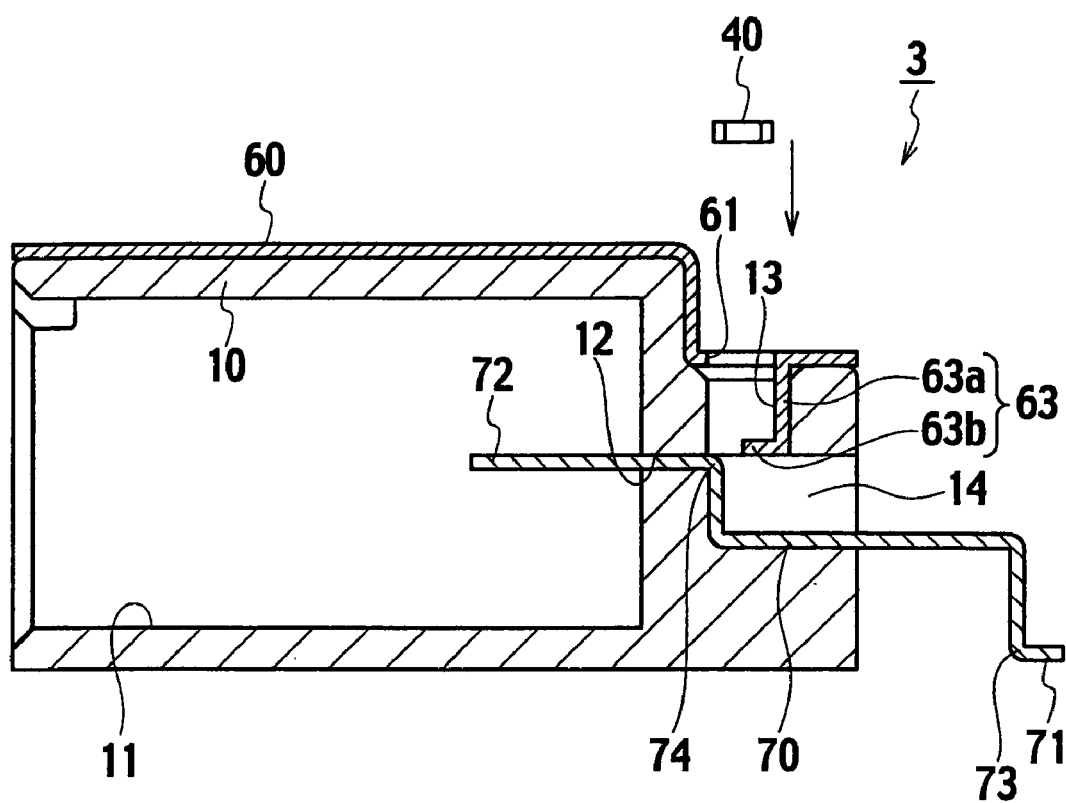
FIG. 9 is a sectional diagram illustrating a connector according to a third embodiment.

FIG. 9 is a sectional diagram illustrating the connector 3 of the third embodiment. As shown in FIG. 9, the connector 3 of the third embodiment includes a connection terminal 70 in place of the first and second terminals 20 and 30. The connection terminal 70 is a long flat plate-shaped metal piece, and formed into a stair shape by bending the long flat plate-shaped metal piece by 90° at four places. One end 71 of the connection terminal 70 extends to a rear side of the connector housing 10, and a first bent part 73 from the rear side is mounted on the surface of the substrate circuit to be electrically connected to the substrate circuit. The other end 72 of the connection terminal 70 projects into a terminal housing space 11 to be electrically connected to a terminal of an opposite side connector (not shown). A part (first bent part 74 from the front) of the connection terminal 70 enters the opening 13. According to the third embodiment, the connector housing 10 includes a terminal insertion port 14 formed in its rear side, and the connection terminal 70 is inserted into the through-hole 12 from the terminal insertion port 14 to be fixed.

The shield case 60 of the third embodiment is similar to that of the second embodiment, but further includes a connection piece 63. The connection piece 63 includes a first piece 63a drooping from the rear side of the second opening 61, and a second piece 63b disposed in a tip of the first piece 63a to extend forward. When the shield case 60 covers the connector housing 10, the second piece 63b is arranged to face a part of the connection terminal 70 in the opening 13. In the connector 3 of the third embodiment, a capacitor is entered as an electronic component 40 to remove a high-frequency wave flowing through the connection terminal 70.

Figure 10:
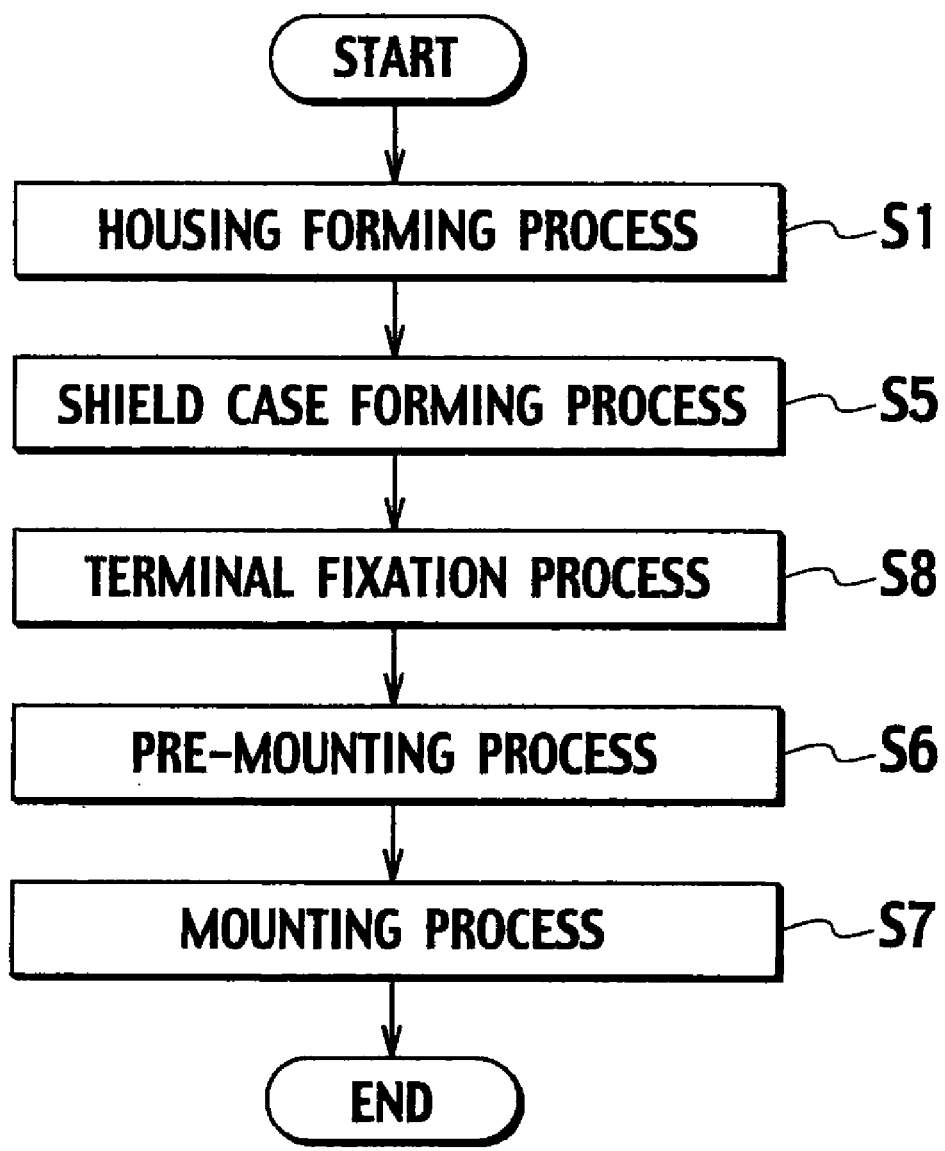
FIG. 10 is a flowchart illustrating a substrate mounting method for a connector 3 according to the third embodiment.

A method for mounting the connector 3 on the substrate according to the third embodiment will be described. FIG. 10 is a flowchart illustrating the substrate mounting method for the connector 3 of the third embodiment. As shown in FIG. 10, first, housing formation is carried out (S1). This step is similar to that of the second embodiment.

Shield case formation is carried out (S5). This step is similar to that of the second embodiment. According to the third embodiment, a connection piece 63 is formed by press-molding a copper plate.

Terminal fixing is carried out (S8). In this step, the connection terminal 70 is inserted into the through-hole 12 via the terminal insertion port 14 of the connector housing 10. In this case, a bent part 74 of the connection terminal 70 enters the opening 13.

Then, steps similar to the mounting preparation and substrate mounting steps of the second embodiment are carried out (S6 and S7). In the substrate mounting step (S7), electrical connection of the connection terminal 70 with the substrate circuit, electrical connection of the electronic component 40, and mounting of the shield case 60 are simultaneously carried out.

According to the connector 3 of the third embodiment, the capacitor to be connected to the connection terminal 70 and the shield case 60 can be entered from the opening 13 and the second opening 61. Thus, a connector 3 on which no capacitor is mounted is manufactured, the capacitor can be entered from the opening 13 and the second opening 61 immediately before the connection terminal 70 is soldered to the substrate circuit, and soldering to mount the capacitor and soldering to electrically connect the connection terminal 70 to the substrate circuit can be simultaneously carried out. As a result, removal of the capacitor caused by heat generated during soldering of the connection terminal can be prevented. As the opening 13 is open in a direction orthogonal to the substrate surface, and the second opening 61 matches the opening 13, a connected state of the capacitor can be checked from the orthogonal direction, and checking work can be carried out relatively easily even in a densely arranged state of connectors 3. Thus, a connection failure of the electronic component 40 can be suppressed, and time and labor for checking a connected state of the electronic component 40 can be reduced. Moreover, as the shield case 60 is electrically connected to the ground of the substrate circuit, and the capacitor can be entered from the second opening 61, by entering the capacitor from the second opening after the connector housing 10 is covered with the shield case 60, soldering of the shield case can be carried out simultaneously with soldering of the other components. As a result, removal of the electronic component 40 caused by heat generated during soldering of the shield case 60 can be prevented. Furthermore, as the connection terminal 70 and the shield case 60 are electrically connected to each other, a high-frequency wave flowing through the connection terminal 70 can be removed.

To be electrically connected to the substrate circuit, the connection terminal 70 is mounted on the surface of the substrate circuit. Thus, for a connector 3 of a type in which a connection terminal 70 is mounted on a substrate surface, a connection failure of an electronic component can be suppressed, and time and labor for checking a connected state of the electronic component can be reduced.

According to the substrate mounting method for the connector 3 of the third embodiment, in the same step as that of connecting one end 71 of the connection terminal 70 to the substrate circuit, a part of the connection terminal 70 is connected to the shield case 60 via the capacitor. Thus, soldering to mount the capacitor and soldering to electrically connect the connection terminal 70 to the shield case 60 are simultaneously carried out, enabling prevention of removal of the capacitor caused by heat generated during soldering of the connection terminal 70. As the opening 13 is open in a direction orthogonal to the substrate surface, and the second opening 61 matches the opening, after the connection terminal 70 is electrically connected to the substrate circuit, and the capacitor is mounted, a connected state of the capacitor can be checked from the orthogonal direction, and checking work can be carried out relatively easily even in a densely arranged state of capacitors 3. Thus, a connection failure of the electronic component 40 can be suppressed, and time and labor for checking a connected state of the electronic component 40 can be reduced. Moreover, the shield case 60 is electrically connected to the ground of the substrate circuit in the same step as that of electrically connecting one end of the connection terminal 70 to the substrate circuit and the step of electrically connecting the connection terminal 70 and the shield case 60 to each other via the capacitor. Thus, mounting of the shield case 60 is simultaneously carried out, enabling prevention of removal of the capacitor caused by heat generated during soldering of the shield case 60. Besides, as the connection terminal 70 and the shield case 60 are electrically connected to each other, a high-frequency wave flowing through the connection terminal 70 can be removed.

The embodiments of the present invention have been described. However, the embodiments are in no way limitative of the invention. Changes can be made without departing from the gist of the invention, and the embodiments can be combined. For example, according to the embodiments, the second terminal 30 and the connection terminal 70 are soldered to the substrate surface. Not limited to this, however, a through-hole may be formed in the substrate, and the second terminal 30 and the connection terminal 70 may be inserted into the through-hole, and soldered in the inserted state.

According to the embodiments, after mounting of the connectors 1 to 3 on the substrate, the opening 13 and the second opening 61 may be buried by resins. The connection terminal 70 is inserted from the terminal insertion port 14. Not limited to this, however, the connection terminal 70 may be formed integrally with the connector housing 10.

What is claimed is:

1. A connector, comprising:
    a connector housing made of an insulator, having a first opening;
    a first terminal having a first end fixed to the connector housing and a second end connected to an opposite side connector;
    a second terminal having a first end electrically connected to a circuit on a substrate and a second end fixed to the connector housing; and
    a shield case covering the connector housing, the shield case including a second opening opened in a place matched with the first opening in a state of covering the connector housing,
    wherein:
        the first end of the first terminal and the second end of the second terminal enter into the first opening;
        the first opening is open in a direction orthogonal to a surface of the substrate in a state where the connector is mounted on the substrate, and is formed so as to permit an electronic component being connected to the first end of the first terminal and the second end of the second terminal to enter thereinto; and
        the first and second openings permit the electronic component to enter thereinto.

2. The connector according to claim 1, wherein an inner wall of the first opening positions or holds the electronic component.

3. The connector according to claim 1, wherein the first opening permits a capacitor being connected to the first end of the first terminal and the second end of the second terminal to enter thereinto.

4. The connector according to claim 1, wherein the second terminal is mounted on the circuit to be electrically connected to the circuit.

5. The connector according to claim 4, wherein the first end of the second terminal is bended in a direction parallel to the surface of the substrate to be electrically connected to the circuit.

6. The connector according to claim 5, wherein a bended portion of the first end of the second terminal is located higher than a bottom surface of the connector housing to arrange solder between the bended portion and the circuit.

7. A connector, comprising:
    a connector housing made of an insulator, having a first opening;

a connection terminal fixed to the connector housing and having one end electrically connected to a circuit on a substrate and the other end connected to an opposite side connector; and a shield case covering the connector housing and being electrically connected partially to a ground of the circuit, the shield case including a second opening opened in a place matched with the first opening in a state of covering the connector housing;

wherein:

the first opening is open in a direction orthogonal to a surface of the substrate in a state where the connector is mounted on the substrate;

a part of the connection terminal enters into the first opening; and the first and second openings permit a capacitor being connected to the part of the connection terminal and the shield case to enter thereinto.

8. The connector according to claim 7, wherein the connection terminal is mounted on the circuit to be electrically connected to the circuit.

9. The connector according to claim 8, wherein an end of the connection terminal is bended in a direction parallel to the surface of the substrate to be electrically connected to the circuit.

10. The connector according to claim 9, wherein a bended portion of connection terminal is located higher than a bottom surface of the connector housing to arrange solder between the bended portion and the circuit.

11. A method for mounting a connector on a substrate, comprising:

a housing formation step of forming a connector housing made of an insulator and including a first opening opened in a direction orthogonal to a surface of the substrate in a step of being mounted on the substrate;

a shield case formation step of forming a shield case including a second opening opened in a place matched with the first opening in a state of covering the connector housing;

a terminal fixing step of fixing a connection terminal having one end electrically connected to a circuit of the substrate and the other end connected to an opposite side connector to the connector housing formed in the housing formation step to enter a part of the connection terminal through the first opening;

a mounting preparation step of mounting the connector housing to which the connection terminal has been fixed in the terminal fixing step to bring one end of the second terminal into contact with the circuit, bringing a part of the shield case into contact with a ground of the circuit in a state of covering the connector housing mounted on the substrate with the shield case formed in the shield case formation step, and entering a capacitor from the first opening of the connector housing and the second opening of the shield case; and a substrate mounting step of electrically connecting one end of the connection terminal brought into contact with the circuit in the mounting preparation step to the circuit, electrically connecting the connected terminal and the shield case to each other via the entered capacitor, and electrically connecting a part of the shield case to the ground of the circuit.

* * * * *